(12) United States Patent
Yoshida et al.

(10) Patent No.: US 11,127,469 B2
(45) Date of Patent: Sep. 21, 2021

(54) NONVOLATILE SEMICONDUCTOR STORAGE DEVICE

(71) Applicant: FLOADIA CORPORATION, Kodaira (JP)

(72) Inventors: Shinji Yoshida, Kodaira (JP); Kazumasa Yanagisawa, Kodaira (JP); Shuichi Sato, Kodaira (JP); Yasuhiro Taniguchi, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 32 days.

(21) Appl. No.: 16/491,704

(22) PCT Filed: Feb. 5, 2018

(86) PCT No.: PCT/JP2018/003794
§ 371 (c)(1),
(2) Date: Sep. 6, 2019

(87) PCT Pub. No.: WO2018/173513
PCT Pub. Date: Sep. 27, 2018

(65) Prior Publication Data
US 2020/0075105 A1    Mar. 5, 2020

(30) Foreign Application Priority Data

Mar. 24, 2017  (JP) .............................. JP2017-059316

(51) Int. Cl.
*G11C 11/34*        (2006.01)
*G11C 16/24*        (2006.01)
(Continued)

(52) U.S. Cl.
CPC .......... *G11C 16/24* (2013.01); *G11C 16/0433* (2013.01); *G11C 16/10* (2013.01);
(Continued)

(58) Field of Classification Search
CPC ..... G11C 16/24; G11C 16/0433; G11C 16/10; G11C 16/30; G11C 16/28; G11C 16/14; H01L 29/42364
(Continued)

(56) References Cited

U.S. PATENT DOCUMENTS

2007/0058441 A1    3/2007  Oka et al.
2007/0247914 A1   10/2007  Fang et al.
(Continued)

FOREIGN PATENT DOCUMENTS

JP    2005-175411 A    6/2005
JP    2007-110073 A    4/2007
(Continued)

OTHER PUBLICATIONS

International Search Report Issued in Patent Application No. PCT/JP2018/003794 dated Mar. 27, 2018.
Written Opinion Issued in Patent Application No. PCT/JP2018/003794 dated Mar. 27, 2018.
(Continued)

*Primary Examiner* — Huan Hoang
*Assistant Examiner* — Minh Dinh
(74) *Attorney, Agent, or Firm* — Pearne & Gordon LLP

(57) ABSTRACT

A non-volatile semiconductor memory device that achieves downsizing as compared to conventional cases is disclosed. A non-volatile semiconductor memory device has a configuration in which a memory cell is disposed between a programming bit line and a reading bit line. The reading bit line provided between adjacent memory cells is shared by the adjacent memory cells. This configuration of the non-volatile semiconductor memory device, in which the reading bit line is shared by the adjacent memory cells, leads to reduction of the number of reading bit lines as compared to that in a conventional configuration, and further leads to reduction of the area of a control circuit and a sense amplifier circuit connected with the reading bit line, thereby (Continued)

achieving downsizing as compared to conventional cases accordingly.

5 Claims, 4 Drawing Sheets

(51) Int. Cl.
  *G11C 16/04*    (2006.01)
  *G11C 16/10*    (2006.01)
  *G11C 16/30*    (2006.01)
  *G11C 16/28*    (2006.01)
  *G11C 16/14*    (2006.01)
  *H01L 29/423*    (2006.01)

(52) U.S. Cl.
  CPC .............. *G11C 16/28* (2013.01); *G11C 16/30* (2013.01); *G11C 16/14* (2013.01); *H01L 29/42364* (2013.01)

(58) Field of Classification Search
  USPC ..................................................... 365/185.21
  See application file for complete search history.

(56) References Cited

U.S. PATENT DOCUMENTS

| | | |
|---|---|---|
| 2015/0187782 A1 | 7/2015 | Yamakoshi et al. |
| 2015/0262666 A1 | 9/2015 | Taniguchi et al. |
| 2017/0040058 A1* | 2/2017 | Shinagawa ....... H01L 27/11524 |

FOREIGN PATENT DOCUMENTS

| | | |
|---|---|---|
| JP | 2009-538519 A | 11/2009 |
| JP | 2014-086435 A | 5/2014 |
| JP | 2015-128083 A | 7/2015 |

* cited by examiner

FIG. 2

|  | PROGRAMMING OPERATION | | READING OPERATION | | ERASING OPERATION |
|---|---|---|---|---|---|
|  | SELECTED | NONSELECTED | SELECTED | NONSELECTED | |
| PROGRAMMING BIT LINE (PG) | Vp(12V) | Vi(4V) | 0V | 0V | Vi(4V) |
| READING BIT LINE (BL) | 0V | 0V | Vdd(1.5V) | 0V | 0V |
| CONTROL GATE LINE (CG) | Vn(-8V) | Vdd(1.5V) | Vdd(1.5V) | Vdd(1.5V) | Vp(12V) |
| SUBSTRATE VOLTAGE LINE (NW) | Vp(12V) | Vp(12V) | Vdd(1.5V) | Vdd(1.5V) | Vp(12V) |
| FIRST SWITCH GATE LINE (RG0) (SELECTED READ CELL) | 0V | 0V | Vdd(1.5V) | Vdd(1.5V) | 0V |
| SECOND SWITCH GATE LINE (RG1) (NONSELECTED READ CELL) | 0V | 0V | 0V | 0V | 0V |
| SOURCE LINE (SL) | 0V | 0V | 0V | 0V | 0V |
| ERASE GATE LINE (EG) | 0V | 0V | 0V | 0V | Vn(-8V) |

NONVOLATILE SEMICONDUCTOR STORAGE DEVICE

TECHNICAL FIELD

The present invention relates to a non-volatile semiconductor memory device.

BACKGROUND ART

A non-volatile semiconductor memory device having a single-layer polysilicon gate structure is known as a memory device that can be easily manufactured through a typical complementary metal-oxide-semiconductor (CMOS) process. Patent Literature 1 discloses a memory device as a non-volatile semiconductor memory device, which includes a memory cell, a programming bit line, and a reading bit line. The memory cell includes a memory transistor, a coupling capacitor, and a capacitor in a charge injection region that share a floating gate. The programming bit line is connected with the capacitor in the charge injection region, and the reading bit line is connected with the memory transistor.

CITATION LIST

Patent Literature

Patent Literature 1: Japanese Patent Laid-Open No. 2005-175411

SUMMARY OF INVENTION

Technical Problem

However, in the non-volatile semiconductor memory device disclosed in Patent Literature 1, the programming bit line and the reading bit line are provided for each memory cell column, and thus an increased number of bit lines need to be controlled. This configuration leads to complication of peripheral circuits such as a bit line control circuit and a sense amplifier circuit, area increase, and difficulty in downsizing.

The present invention is intended to solve the above-described problem and provide a non-volatile semiconductor memory device that achieves downsizing as compared to conventional cases.

Solution to Problem

To solve the above-described problem, a non-volatile semiconductor memory device according to the present invention includes: a plurality of programming bit lines extending in a column direction; a plurality of reading bit lines extending in the column direction; a plurality of first switch gate lines extending in a row direction; a plurality of second switch gate lines extending in the row direction; and a plurality of memory cells disposed between the programming bit lines and the reading bit lines and connected with the programming bit lines and the reading bit lines. Each memory cell includes: a program transistor; a control capacitor; a read transistor; and a switch transistor, one of source and drain of which is connected with one of source and drain of the read transistor, and that is connected in series with the read transistor. The program transistor, the control capacitor, and the read transistor share a floating gate. The programming bit line is connected with one of source and drain of the program transistor, and the reading bit line is connected with the other of source and drain of the switch transistor. The reading bit line is shared by one of the memory cells and another of the memory cells, which are adjacent to each other in the row direction. The first switch gate line is connected with a gate of the switch transistor of the one memory cell, and the second switch gate line is connected with a gate of the switch transistor of the other memory cell.

Advantageous Effects of Invention

According to the present invention, the configuration of a non-volatile semiconductor memory device in which a reading bit line is shared by memory cells adjacent to each other leads to reduction of the number of reading bit lines as compared to that in a conventional configuration, and further leads to reduction of the area of a control circuit and a sense amplifier circuit connected with the reading bit line, thereby achieving downsizing as compared to conventional cases accordingly.

BRIEF DESCRIPTION OF DRAWINGS

FIG. 2 is a table listing an exemplary voltage applied to each wire at a data programming operation, a data reading operation, and a data erasing operation.

DESCRIPTION OF EMBODIMENTS

Hereinafter, embodiments of the present invention will be described in the following order.
<1. Configuration of non-volatile semiconductor memory device>
<2. Three kinds of charge pumps>
<3. Operations and effects>
<4. Non-volatile semiconductor memory device provided with differential sense circuit and current sense circuit>
<5. Other embodiments>

(1) Configuration of Non-Volatile Semiconductor Memory Device

Figure 1:
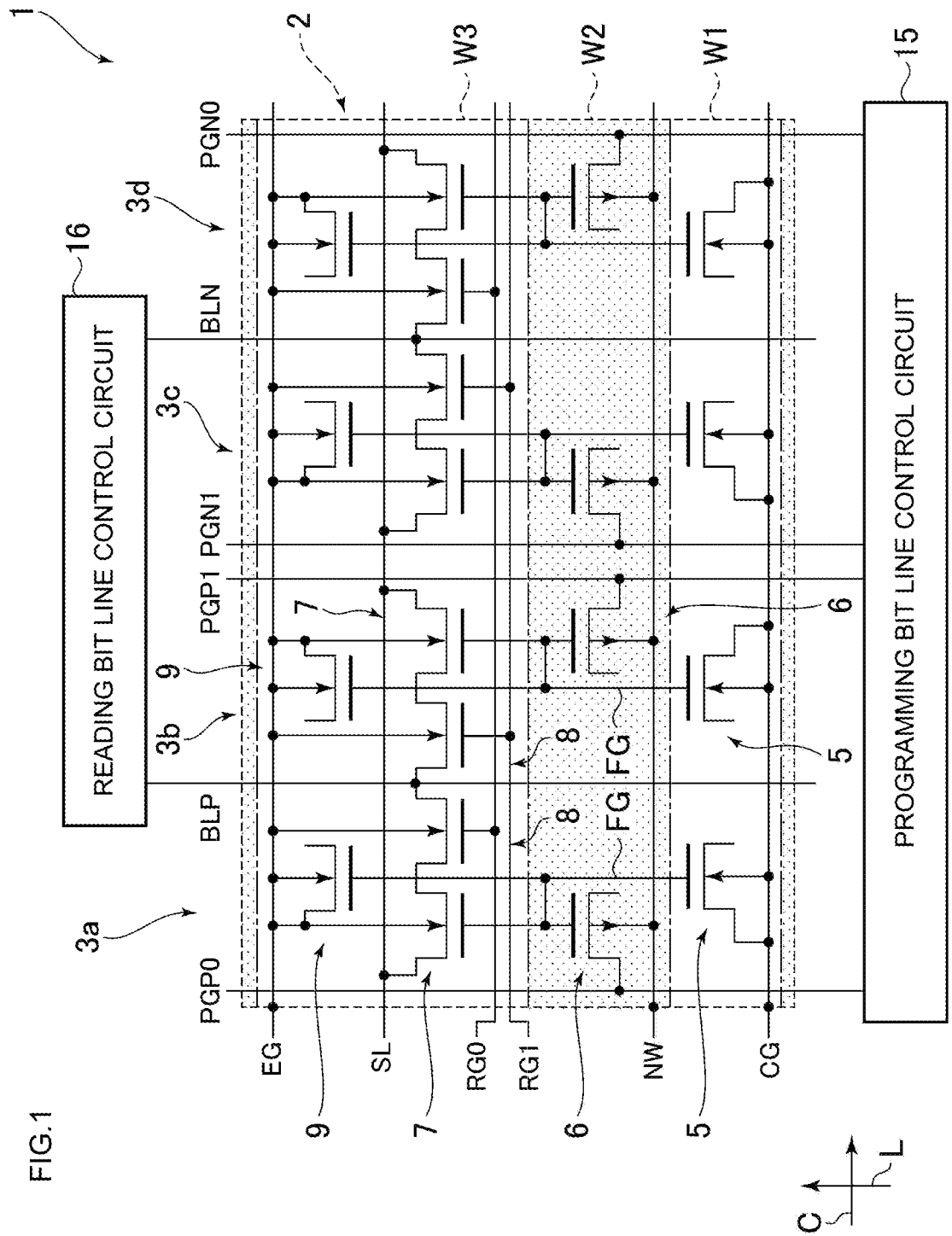
FIG. 1 is a circuit diagram illustrating a circuit configuration of a non-volatile semiconductor memory device according to the present invention.

FIG. 1 illustrates a circuit configuration of a non-volatile semiconductor memory device 1 according to the present invention. The non-volatile semiconductor memory device 1 is provided with a memory cell array 2 including a plurality of memory cells 3a, 3b, 3c, 3d, . . . disposed in a matrix of rows and columns in a row direction C and a column direction L. FIG. 1 illustrates only the four memory cells 3a, 3b, 3c, and 3d arranged in the row direction C, and omits illustration of other memory cells disposed on the other rows.

The following description focuses on the configuration of the memory cell 3a. The memory cell 3a includes a control capacitor 5, a program transistor 6, a read transistor 7, a switch transistor 8, and an erase capacitor 9. One floating gate FG is shared by the control capacitor 5, the program transistor 6, the read transistor 7, and the erase capacitor 9.

The control capacitor 5 is disposed in a P-type well W1. The P-type well W1 is connected with a control gate line CG through a high concentration N-type diffusion layer (not illustrated). The potential of the control gate line CG is applied to the P-type well W1 and further applied to the floating gate FG through capacitive coupling. A capacitive coupling ratio α is preferably set to exceed 0.9, when the capacitive coupling ratio α is the ratio of the capacitance between the floating gate FG and the well W1 at the control capacitor 5 relative to the sum of the capacitance between the floating gate FG and the well W1 at the control capacitor 5, the capacitance between the floating gate FG and a well W2 at the program transistor 6 to be described later, the capacitance between the floating gate FG and a well W3 at the erase capacitor 9 to be described later, and the capacitance between the floating gate FG and the well W3 at the read transistor 7 to be described later. The potential applied to the floating gate FG is expressed by α×Vcg, where Vcg represents the potential Vcg of the control gate line CG. When α is set to exceed 0.9, most of the potential Vcg of the control gate line CG is applied to the floating gate FG. To simplify the following description, α is taken to be substantially 1, and the potential Vcg of the control gate line is applied to the floating gate FG through capacitive coupling so that the potential of the floating gate FG is equal to Vcg.

The program transistor 6 is a P-type MOS disposed in the N-type well W2. A programming bit line PGP0 is connected with a high concentration P-type diffusion layer serving as the source and drain of the program transistor 6. A predetermined voltage is applied from a substrate voltage line NW to the N-type well W2 in which the program transistor 6 is disposed.

The erase capacitor 9 is disposed in the P-type well W3, which is different from the P-type well W1 in which the control capacitor 5 is disposed. The P-type well W3 is connected with an erase gate line EG through the high concentration N-type diffusion layer (not illustrated). The potential of the erase gate line EG is applied to the P-type well W3. When the capacitive coupling ratio α is set to exceed 0.9, the ratio of the capacitance between the floating gate FG and the well W3 at the erase capacitor 9 relative to the sum of the capacitance between the floating gate FG and the well W1 at the control capacitor 5, the capacitance between the floating gate FG and the well W2 at the program transistor 6, the capacitance between the floating gate FG and the well W3 at the erase capacitor 9, and the capacitance between the floating gate FG and the well W3 at the read transistor 7 to be described later is equal to or lower than 0.1. Accordingly, the potential applied from the erase gate line EG to the floating gate is negligibly small.

The read transistor 7 is an N-type MOS disposed in the P-type well W3, in which the erase capacitor 9 is disposed. One of the source and drain of the read transistor 7 is connected with one of the source and drain of the switch transistor 8, and the read transistor 7 is connected in series with the switch transistor 8. A source line SL is connected with the high concentration N-type diffusion layer serving as the other of the source and drain of the read transistor 7. The switch transistor 8 is an N-type MOS disposed in the P-type well W3, in which the erase capacitor 9 is disposed. A reading bit line BLP is connected with the high concentration N-type diffusion layer serving as the other of the source and drain of the switch transistor 8, and a first switch gate line RG0 is connected with the gate of the switch transistor 8. The switch transistor 8 is turned on or off to allow electrical connection or disconnection between the reading bit line BLP and the read transistor 7, respectively.

In the non-volatile semiconductor memory device 1, the programming bit line PGP0 extends in the column direction L and is connected with the memory cell 3a, . . . (FIG. 1 only illustrates the memory cells 3a, 3b, 3c, and 3d on the first row) arranged in the column direction L. The programming bit line PGP0 is connected with the high concentration P-type diffusion layer serving as the source and drain of the program transistor 6 at each of the memory cell 3a, . . . arranged in the column direction L. The programming bit line PGP0 and other programming bit lines PGP1, PGN1, and PGN0 are provided at the respective memory cell columns.

In the non-volatile semiconductor memory device 1, the reading bit line BLP extends in the column direction L and is connected with the memory cell 3a, . . . arranged in the column direction L. The reading bit line BLP is connected with the high concentration N-type diffusion layer serving as the other of the source and drain of the switch transistor 8 at each of the memory cell 3a, . . . arranged in the column direction L. Each reading bit line BLP is provided for two memory cell columns adjacent to each other (a memory cell column on which the memory cell 3a is disposed, and a memory cell column on which the memory cell 3b adjacent to the memory cell 3a is disposed).

The memory cells 3a and 3b adjacent to each other are disposed at line symmetric positions with the symmetrical axis at the column direction L. The memory cells 3a and 3b have a common source or drain, which is shared by the other of source and drain of the switch transistor 8 of the memory cell 3a and the other of source and drain of the switch transistor 8 of the memory cell 3b. In the non-volatile semiconductor memory device 1, the reading bit line BLP is connected with this common source or drain (also referred to as a common source/drain) and shared by memory cell columns adjacent to each other. Accordingly, in the non-volatile semiconductor memory device 1, the single reading bit line BLP (BLN) is provided for the two programming bit lines PGP0 and PGP1 (PGN1 and PGN0).

In the non-volatile semiconductor memory device 1, the configuration in which the single reading bit line BLP is disposed between the two programming bit lines PGP0 and PGP1 is disposed at line symmetric positions with the column direction L at the symmetrical axis. Accordingly, the programming bit line PGP0, the reading bit line BLP, the programming bit line PGP1, the programming bit line PGN1, the reading bit line BLN, and the programming bit line PGN0 are disposed side by side in this order in the non-volatile semiconductor memory device 1.

In the non-volatile semiconductor memory device 1, the memory cells 3a, 3b, 3c, and 3d arranged in the row direction C are connected with the erase gate line EG. With this configuration, the memory cells 3a, 3b, 3c, and 3d share the same erase gate line EG. The erase gate line EG is connected with the high concentration N-type diffusion layer of the erase capacitor 9 of each of the memory cells 3a, 3b, 3c, and 3d arranged in the row direction C. The memory cells 3a, 3b, 3c, and 3d arranged in the row direction C are connected with the source line SL. With this configuration, the memory cells 3a, 3b, 3c, and 3d share the same source line SL. The source line SL is connected with the high concentration N-type diffusion layer serving as the other of the source and drain of the read transistor 7 of each of the memory cells 3a, 3b, 3c, and 3d arranged in the row direction C.

In the non-volatile semiconductor memory device 1, the memory cells 3a, 3b, 3c, and 3d arranged in the row direction C are connected with the control gate line CG. With this configuration, the memory cells 3a, 3b, 3c, and 3d share the same control gate line CG. The control gate line CG is connected with the high concentration N-type diffusion layer of the control capacitor 5 of each of the memory cells 3a, 3b, 3c, and 3d arranged in the row direction C.

In the non-volatile semiconductor memory device 1, the first switch gate line RG0 and a second switch gate line RG1 are provided in the row direction C. The first switch gate line RG0 is connected with the memory cell 3a (3d) as one of the memory cells 3a and 3b (3c and 3d) sharing the reading bit line BLP (BLN). The second switch gate line RG1 is connected with the other memory cell 3b (3c) sharing the reading bit line BLP (BLN) with the memory cell 3a (3d) connected with the first switch gate line RG0.

In the present embodiment, the first switch gate line RG0 is connected with the gate of the switch transistor 8 of the memory cell 3a as one of the memory cells 3a and 3b sharing the reading bit line BLP so that the switch transistor 8 is turned on and off based on voltage applied from the first switch gate line RG0. The second switch gate line RG1 is connected with the gate of the switch transistor 8 of the other memory cell 3b sharing the reading bit line BLP with the one memory cell 3a so that the switch transistor 8 is turned on and off based on voltage applied from the second switch gate line RG1.

Thus, although the memory cells 3a and 3b share the single reading bit line BLP, the switch transistors 8 thereof can be individually turned on and off so that only the read transistor 7 of any one of the memory cells 3a and 3b is electrically connected with the reading bit line BLP.

In the non-volatile semiconductor memory device 1, a programming bit line control circuit 15 is connected with the programming bit lines PGP0, PGP1, PGN1, and PGN0 so that a predetermined voltage is individually applied from the programming bit line control circuit 15 to each of the programming bit lines PGP0, PGP1, PGN1, and PGN0 at data programming and erasing operations. In the non-volatile semiconductor memory device 1, a reading bit line control circuit 16 is connected with the reading bit lines BLP and BPN so that, for example, a reading voltage is individually applied from the reading bit line control circuit 16 to each of the reading bit lines BLP and BPN at a data reading operation.

FIG. 2 lists an exemplary voltage applied to each wire at the data programming operation in which data is programmed by injecting charge into the floating gate FG of a selected memory cell, at the data reading operation in which whether charge is injected in the floating gate FG of a selected memory cell is determined, and at the data erasing operation in which charge is removed from the floating gate FG.

The following describes an example in which data is programmed to the memory cell 3a. A negative voltage Vn (for example, −8 V) is applied to the control gate line CG (hereinafter also referred to as a selected program control gate line) connected with the memory cell 3a (hereinafter also referred to as a selected program memory cell) to which data is to be programmed. Accordingly, the potential of the P-type well W1 at a memory cell row including the selected program memory cell becomes equal to the voltage Vn, and the potential of the floating gate FG becomes equal to the voltage Vn through capacitive coupling.

A positive high voltage Vp (for example, 12 V) is applied from the programming bit line control circuit 15 to the programming bit line PGP0 (hereinafter also referred to as a selected programming bit line) connected with the selected program memory cell. Accordingly, the potential of a channel of each program transistor 6 at a memory cell column including the selected program memory cell becomes equal to the voltage Vp. In the program transistor 6 of the selected program memory cell, charge is injected into the floating gate FG by the tunneling effect due to the potential difference between the floating gate FG at a potential equal to the voltage Vn and the channel at the voltage Vp.

The following describes an example in which data is read from the memory cell 3a. A power supply voltage Vdd (for example, 1.5 V) is applied to the reading bit line BLP (hereinafter also referred to as a selected reading bit line) connected with the memory cell 3a (hereinafter also referred to as a selected read memory cell) from which data is to be read. The power supply voltage Vdd (for example, 1.5 V) is applied to the first switch gate line RG0 connected with the selected read memory cell 3a among the memory cells 3a and 3b sharing the reading bit line BLP.

Accordingly, the switch transistor 8 of the selected read memory cell 3a is turned on to allow electrical connection between the read transistor 7 and the selected reading bit line BLP. A voltage of 0 V is applied from the second switch gate line RG1 to the gate of the switch transistor 8 of the other memory cell 3b (hereinafter also referred to as a nonselected read memory cell) sharing the selected reading bit line BLP with the selected read memory cell 3a. Accordingly, the switch transistor 8 of the nonselected read memory cell 3b is turned off to allow electrical disconnection between the read transistor 7 and the selected reading bit line BLP.

At the data erasing operation, the voltage Vp (for example, 12 V) is applied to the control gate line CG. Accordingly, the potential of the P-type well W1 becomes equal to the voltage Vp, and the potential of the floating gate FG becomes equal to the voltage Vp through capacitive coupling. The voltage Vn (for example, −8 V) is applied to the erase gate line EG, and the potential of the P-type well W3 becomes equal to the voltage Vn. Accordingly, charge is removed from the floating gate FG by the tunneling effect due to the potential difference between the floating gate FG and the well W3.

The programming bit line control circuit 15 needs to apply, to the selected programming bit line, the voltage Vp that is high enough to cause the tunneling effect. Thus, the programming bit line control circuit 15 is achieved by a high breakdown voltage transistor capable of applying the high voltage Vp.

At the data programming and erasing operations, the switch transistor 8 of each of the memory cells 3a, 3b, 3c, and 3d is turned off by application of voltage (for example, 0 V) from the first switch gate line RG0 and the second switch gate line RG1, thereby electrical disconnection between the read transistor 7 and each of the reading bit lines BLP and BLN. Accordingly, in the non-volatile semiconductor memory device 1, due to this disconnection in data programming and data erasing, the high voltage applied to the memory cells 3a, 3b, 3c, and 3d is shut off just before the reading bit line control circuit 16 connected with the reading bit lines BLP and BLN.

Accordingly, as illustrated in FIG. 2, the reading bit line control circuit 16 applies a reading bit voltage equal to or lower than the power supply voltage Vdd to the reading bit lines BLP and BPN at the data reading operation, and thus can be configured even if a core MOS transistor having a low breakdown voltage. With this configuration, a gate insulating film of the transistor included in the reading bit line control circuit 16 can have a thickness thinner than that of a gate insulating film of the transistor included in the programming bit line control circuit 15, thereby achieving reduction of the area of the reading bit line control circuit 16 and high-speed processing at the data reading operation accordingly.

(2) Three Kinds of Charge Pumps

Figure 3:
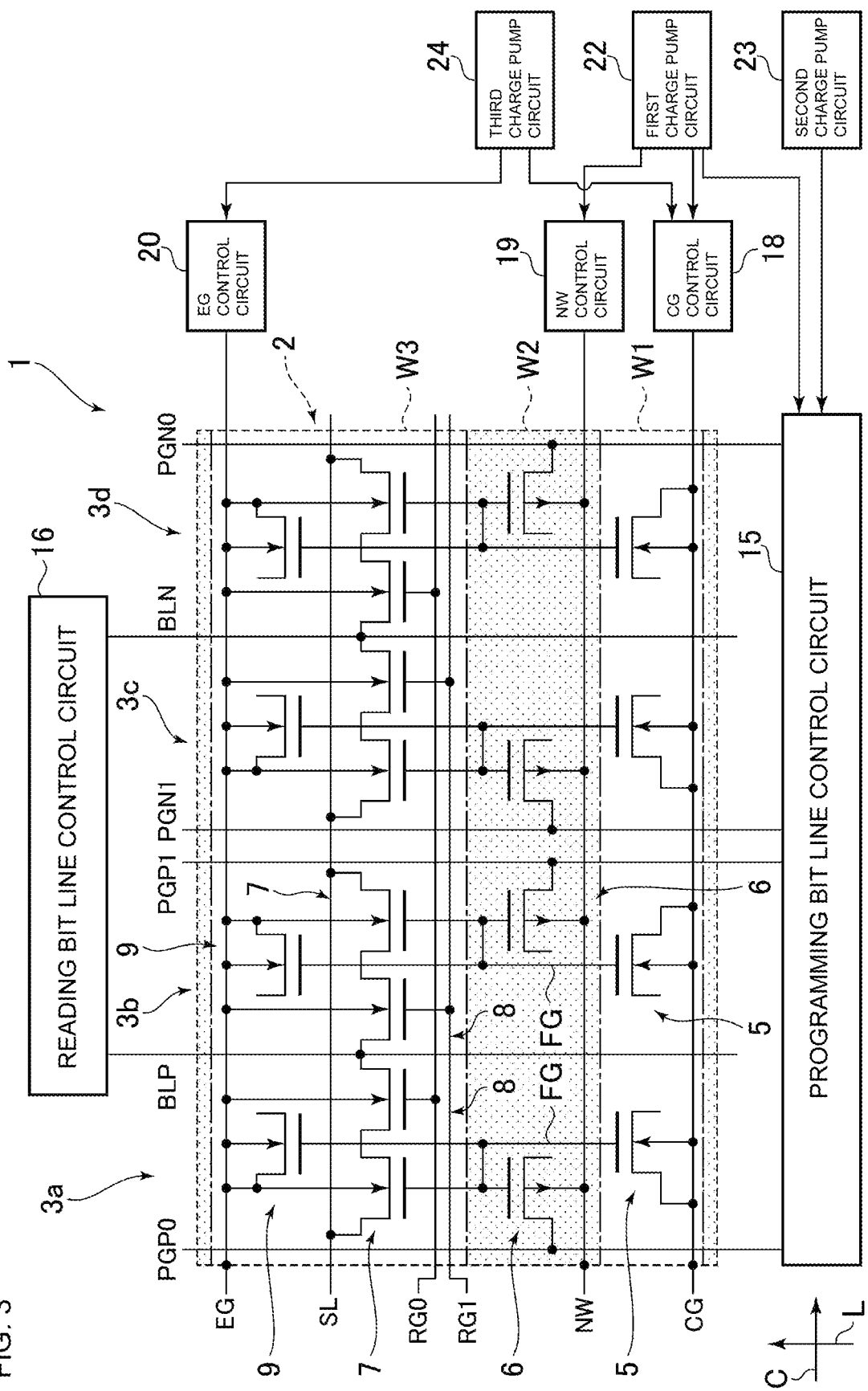
FIG. 3 is a circuit diagram illustrating a circuit configuration of a non-volatile semiconductor memory device provided with three kinds of charge pumps.

As illustrated in FIG. 3, in which any corresponding part to that in FIG. 1 is denoted by an identical reference sign, the non-volatile semiconductor memory device 1 is provided with a first charge pump circuit 22, a second charge pump circuit 23, and a third charge pump circuit 24 configured to generate voltage needed to execute the above-described data programming, erasing, and reading operations.

The control gate line CG is connected with a control gate line control circuit 18 (referred to as "CG control circuit" in FIG. 3) to receive voltage application from the control gate line control circuit 18. The substrate voltage line NW is connected with a substrate voltage line control circuit 19 (referred to as "NW control circuit" in FIG. 3) to receive voltage application from the substrate voltage line control circuit 19. The erase gate line EG is connected with an erase gate line control circuit 20 (referred to as "EG control circuit" in FIG. 3) to receive voltage application from the erase gate line control circuit 20.

The first charge pump circuit 22, the second charge pump circuit 23, and the third charge pump circuit 24 generate voltage at voltage values different from each other. The first charge pump circuit 22, which is connected with the programming bit line control circuit 15, the control gate line control circuit 18, and the substrate voltage line control circuit 19, generates the high voltage Vp (FIG. 2) and applies the voltage Vp to the programming bit lines PGP0, PGP1, PGN1, and PGN0, the control gate line CG, and the substrate voltage line NW.

The second charge pump circuit 23, which is connected with the programming bit line control circuit 15, generates a voltage Vi and applies the voltage Vi (FIG. 2) to the programming bit lines PGP0, PGP1, PGN1, and PGN0. The third charge pump circuit 24, which is connected with the control gate line control circuit 18 and the erase gate line control circuit 20, generates the negative voltage Vn (FIG. 2) and applies the voltage Vn to the control gate line CG and the erase gate line EG.

For example, at the data erasing operation in the non-volatile semiconductor memory device 1, as described above, the voltage Vp (for example, 12 V) is applied to the control gate line CG so that the potential of the P-type well W1 becomes equal to the voltage Vp and the potential of the floating gate FG becomes equal to the voltage Vp through capacitive coupling. At the data erasing operation, the voltage Vn (for example, −8 V) is applied to the erase gate line EG so that the potential of the P-type well W3 becomes equal to the voltage Vn. Accordingly, in the non-volatile semiconductor memory device 1, the potential difference between the floating gate FG and the well W3 becomes equal to 20 V, and as a result, charge is removed from the floating gate FG by the tunneling effect.

Simultaneously, a voltage of 0 V is applied to the reading bit lines BLP and BLN and the source line SL. The voltage of 0 V is applied to the high concentration N-type diffusion layer serving as the source and drain of the switch transistor 8 connected with the reading bit lines BLP and BLN, and the high concentration N-type diffusion layer serving as the source and drain of the read transistor 7 connected with the source line SL, and the voltage Vn (for example, −8 V) is applied to the P-type well W3. Thus, a junction breakdown voltage of 8 V or higher between the high concentration N-type diffusion layer and the P-type well W3 is sufficient.

The voltage Vp (for example, 12 V) is applied from the substrate voltage line NW to the N-type well W2. For example, when a voltage of 0 V is applied to the programming bit lines PGP0, PGP1, PGN1, and PGN0, the voltage of 0 V is applied to the high concentration P-type diffusion layer serving as the source and drain of the program transistor 6, and thus a junction breakdown voltage of 12 V or higher is needed between the high concentration P-type diffusion layer and the N-type well W2. However, according to the present invention, the positive voltage Vi lower than the voltage Vp is applied to the programming bit lines PGP0, PGP1, PGN1, and PGN0, and thus, for example, the high junction breakdown voltage of 12 V or higher is not needed. Specifically, the potential difference between the high concentration P-type diffusion layer and the N-type well W2 is 8 V when the voltage Vi (for example, 4 V) is employed, and thus a junction breakdown voltage of 8 V or higher is sufficient.

For example, when the programming bit line control circuit 15, which controls the voltage Vi, is achieved by a typical CMOS inverter, the voltage Vi is allowed to be, at maximum, the junction breakdown voltage between a high concentration N-type diffusion layer and a P-type well at an NMOS transistor of the CMOS inverter. The voltage Vp is allowed to be, at maximum, the sum of the voltage Vi and the junction breakdown voltage between the high concentration P-type diffusion layer connected with the programming bit lines PGP0, PGP1, PGN1, and PGN0 and the N-type well W2. In other words, the voltage Vp is allowed to be the sum of the junction breakdown voltage between the high concentration N-type diffusion layer and the P-type well at the NMOS transistor of the above-described CMOS inverter and the junction breakdown voltage between the high concentration P-type diffusion layer connected with the programming bit lines PGP0, PGP1, PGN1, and PGN0 and the N-type well W2. For example, when the control gate line control circuit 18 and the erase gate line control circuit 20, which control the voltage Vn, are each achieved by a typical CMOS inverter, the negative voltage Vn is allowed to be, at maximum, the junction breakdown voltage between a high concentration P-type diffusion layer and an N-type well at a PMOS transistor of the CMOS inverter.

For example, the junction breakdown voltage between the high concentration N-type diffusion layer and the P-type well is 8 V, and the junction breakdown voltage between the high concentration P-type diffusion layer and the N-type well is −8 V. When the voltage Vi is not employed, voltage applicable to the memory cells 3a, 3b, 3c, and 3d is the sum of the positive junction breakdown voltage and the negative junction breakdown voltage and is 16 V at maximum, which is substantially twice as high as the absolute value of each junction breakdown voltage. According to the present invention, when the voltage Vi is employed, a voltage applicable to the memory cells 3a, 3b, 3c, and 3d is the sum of a voltage twice the positive junction breakdown voltage and the negative junction breakdown voltage, which is 24 V at maximum. Thus, a voltage substantially three times as high as the absolute value of each junction breakdown voltage can be applied.

A voltage up to three times as high as the junction breakdown voltage can be applied to the memory cells 3a, 3b, 3c, and 3d as described above by simultaneously operating the first charge pump circuit 22, the second charge pump circuit 23, and the third charge pump circuit 24 to generate the voltage Vp, the voltage Vi, and the voltage Vn at the first charge pump circuit 22, the second charge pump circuit 23, and the third charge pump circuit 24, respectively.

(3) Operations and Effects

In the non-volatile semiconductor memory device 1 with the above-described configuration, the memory cell 3a (3b) is disposed between the programming bit line PGP0 (PGP1) and the reading bit line BLP so that the reading bit line BLP provided between the memory cells 3a and 3b adjacent to each other is shared by the adjacent memory cells 3a and 3b. This configuration of the non-volatile semiconductor memory device 1, in which the reading bit line BLP is shared by the memory cells 3a and 3b adjacent to each other, leads to reduction of the number of reading bit lines as compared to that in a conventional configuration, and further leads to reduction of the area of a control circuit and a sense amplifier circuit connected with the reading bit line, thereby achieving downsizing as compared to conventional cases accordingly.

In the non-volatile semiconductor memory device 1, the second switch gate line RG1 is provided separately from the first switch gate line RG0 so that the different first and second switch gate lines RG0 and RG1 are connected with the respective switch transistors 8 of the memory cells 3a and 3b sharing the reading bit line BLP. Accordingly, although the memory cells 3a and 3b adjacent to each other share the reading bit line BLP in the non-volatile semiconductor memory device 1, only the switch transistor 8 of one of the memory cells 3a and 3b can be turned on to connect only the one memory cell 3a (3b) with the reading bit line BLP. Thus, data can be individually read from the memory cells 3a and 3b.

Figure 4:
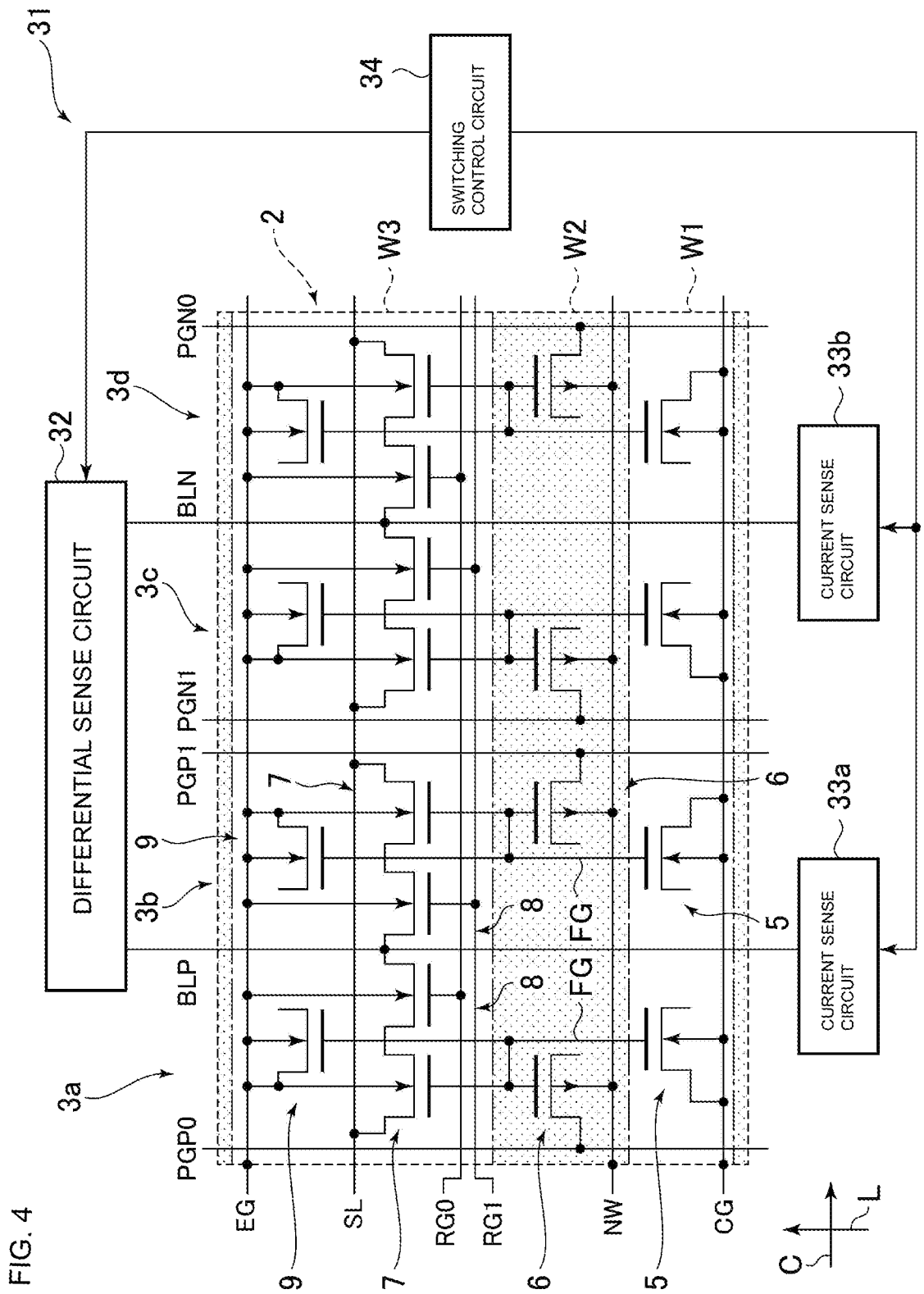
FIG. 4 is a circuit diagram illustrating a circuit configuration of a non-volatile semiconductor memory device provided with a differential sense circuit and a current sense circuit.

(4) Non-Volatile Semiconductor Memory Device Provided with Differential Sense Circuit and Current Sense Circuit The following describes a non-volatile semiconductor memory device in which a differential sense circuit is provided to the reading bit line control circuit 16, and a current sense circuit is provided to the reading bit lines BLP and BLN separately from the differential sense circuit. As illustrated in FIG. 4, in which any corresponding part to that in FIG. 1 is denoted by an identical reference sign, a differential sense circuit 32 and current sense circuits 33a and 33b are provided to the reading bit lines BLP and BLN in a non-volatile semiconductor memory device 31 according to the present embodiment.

The differential sense circuit 32 is connected with the one reading bit line BLP and the other reading bit line BLN to detect the current difference between the one reading bit line BLP and the other reading bit line BLN at the data reading operation. At the data reading operation, a reading bit line control circuit (not illustrated) determines whether charge is injected in the floating gates FG of the memory cells 3a, 3b, 3c, and 3d based on the current difference between the one reading bit line BLP and the other reading bit line BLN detected by the differential sense circuit 32.

For example, when the one memory cell 3a as one of the memory cells 3a and 3b sharing the reading bit line BLP are electrically connected with the one reading bit line BLP, the memory cell 3d sharing the first switch gate line RG0 with the one memory cell 3a is electrically connected with the other reading bit line BLN, the potential difference of which from the one reading bit line BLP is compared by the differential sense circuit 32. In this case, since the differential sense circuit 32 uses the current difference between the reading bit lines BLP and BLN to determine whether charge is injected in the floating gates FG of the memory cells 3a and 3d, only the relative difference between the two memory cells 3a and 3d can be determined, and thus it is impossible to perform absolute-amount determination of whether the amount of charge sufficient to maintain charge in the future is stored.

The current sense circuits 33a and 33b are connected with the respective reading bit lines BLP and BLN to independently detect whether charge is injected in the floating gates FG of the memory cells 3a and 3d (3b and 3c) by causing current to flow through the reading bit lines BLP and BLN at the data reading operation.

The differential sense circuit 32 and the current sense circuits 33a and 33b are connected with a switching control circuit 34. The differential sense circuit 32 and the current sense circuits 33a and 33b are electrically connected or disconnected with the reading bit lines BLP and BLN based on a control signal from the switching control circuit 34. The current sense circuits 33a and 33b can quantitatively evaluate threshold voltages of the memory cells 3a, 3b, 3c, and 3d. Thus, for example, a test operation to check whether the memory cells 3a, 3b, 3c, and 3d normally operate can be executed by using the current sense circuits 33a and 33b at shipment examination in the non-volatile semiconductor memory device 31. In the operation, data is read by using the differential sense circuit 32 at normal use (at the data programming, reading, and erasing operations by a general user).

For example, at normal use, the switching control circuit 34 turns off switches inside the current sense circuits 33a and 33b for electrical disconnection between the current sense circuits 33a and 33b and the reading bit lines BLP and BPN so that the current sense circuits 33a and 33b are not connected with the reading bit lines BLP and BPN.

At test use, the switching control circuit 34 sends connection signals to the current sense circuits 33a and 33b and sends a disconnection signal to the differential sense circuit 32. Accordingly, the switches inside the current sense circuits 33a and 33b are switched to allow electrical connection of the current sense circuits 33a and 33b with the reading bit lines BLP and BPN. Simultaneously, the switch inside the differential sense circuit 32 is switched to the electrical disconnection of the differential sense circuit 32 with the reading bit lines BLP and BPN.

In this manner, in the non-volatile semiconductor memory device 31, the current sense circuits 33a and 33b are not opened in use by the general user at normal use, but are used only at test use to check normal operation of the memory cells 3a, 3b, 3c, and 3d. In the non-volatile semiconductor memory device 31, too, the reading bit line BLP is shared by the memory cells 3a and 3b adjacent to each other, thereby achieving an effect same as that of the above-described non-volatile semiconductor memory device 1.

(5) Other Embodiments

In the above-described embodiment, the memory cells 3a, 3b, 3c, and 3d each include the erase capacitor 9, but the present invention is not limited thereto. The memory cell may include no erase capacitor.

In another embodiment, the conductivity types of N-type and P-type may be opposite among the control capacitor 5, the program transistor 6, the read transistor 7, the switch transistor 8, and the erase capacitor 9 included in each memory cell.

REFERENCE SIGNS LIST 1, 31 non-volatile semiconductor memory device
3a, 3b, 3c, 3d memory cell
5 control capacitor
6 program transistor
7 read transistor
8 switch transistor
15 programming bit line control circuit
16 reading bit line control circuit
32 differential sense circuit
33a, 33b current sense circuit
FG floating gate
BLP, BLN reading bit line
PGP0, PGP1, PGN1, PGN0 programming bit line
RG0 first switch gate line
RG1 second switch gate line
SL0 first source line
SL1 second source line

What is claimed is:

1. A non-volatile semiconductor memory device comprising:
   a plurality of programming bit lines extending in a column direction;
   a plurality of reading bit lines extending in the column direction;
   a plurality of first switch gate lines extending in a row direction;
   a plurality of second switch gate lines extending in the row direction; and
   a plurality of memory cells disposed between the programming bit lines and the reading bit lines and connected with the programming bit lines and the reading bit lines, wherein:
   each of the plurality of memory cells includes:
      a program transistor;
      a control capacitor;
      a read transistor; and
      a switch transistor that is connected in series with the read transistor, one of a source or a drain of the switch transistor being connected with one of a source or a drain of the read transistor,
   the program transistor, the control capacitor, and the read transistor share a floating gate,
   the programming bit line is connected with one of a source or a drain of the program transistor, and the reading bit line is connected with the other of the source or the drain of the switch transistor,
   the reading bit line is shared by a first memory cell and a second memory cell of the plurality of memory cells, the first memory cell and the second memory cell being adjacent to each other in the row direction,
   the other of the source or the drain of the switch transistor of the first memory cell and the other of the source or the drain of the switch transistor of the second memory cell are connected to the reading bit line, and
   the first switch gate line is connected with a gate of the switch transistor of the first memory cell, and the second switch gate line is connected with a gate of the switch transistor of the second memory cell.

2. The non-volatile semiconductor memory device according to claim 1, further comprising:
   a differential sense circuit connected with one of the reading bit lines and another of the reading bit lines; and
   a current sense circuit provided to each reading bit line and connected with the reading bit line.

3. The non-volatile semiconductor memory device according to claim 2, further comprising a switching control circuit configured not to connect the current sense circuit with the reading bit line in normal use and configured to connect the current sense circuit with the reading bit line in test use.

4. The non-volatile semiconductor memory device according to claim 1, wherein the thickness of a gate insulating film of a transistor included in a reading line control circuit connected with the reading bit line is thinner than the thickness of a gate insulating film of a transistor included in a programming bit line control circuit connected with the programming bit line.

5. The non-volatile semiconductor memory device according to claim 1, further comprising:
   a first charge pump circuit that is connected with a programming bit line control circuit connected with the programming bit line, a substrate voltage line control circuit configured to apply voltage to a well of the program transistor, and a control gate line control circuit configured to apply voltage to a well of the control capacitor, and is configured to generate first voltage to be applied to the programming bit line control circuit, the substrate voltage line control circuit, and the control gate line control circuit;
   a second charge pump circuit connected with the programming bit line control circuit and configured to generate second voltage to be applied to the programming bit line control circuit; and
   a third charge pump circuit connected with the control gate line control circuit and configured to generate third voltage to be applied to the control gate line control circuit,
   wherein the first voltage is positive voltage, the second voltage is positive voltage lower than the first voltage, and the third voltage is negative voltage.

* * * * *